United States Patent
Chen et al.

(10) Patent No.: US 7,992,290 B2
(45) Date of Patent: Aug. 9, 2011

(54) METHOD OF MAKING A FLEXIBLE PRINTED CIRCUIT BOARD

(75) Inventors: Ying-Lin Chen, Taipei Hsien (TW); Yung-Chou Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 462 days.

(21) Appl. No.: 11/940,900

(22) Filed: Nov. 15, 2007

(65) Prior Publication Data

US 2009/0011184 A1 Jan. 8, 2009

(30) Foreign Application Priority Data

Jul. 6, 2007 (CN) .......................... 2007 1 0201020

(51) Int. Cl.
*H05K 3/36* (2006.01)
*B32B 3/10* (2006.01)

(52) U.S. Cl. ................ 29/830; 29/831; 29/832; 29/847; 29/852; 428/131

(58) Field of Classification Search .............. 29/852, 29/830, 832, 840, 847; 174/262, 255, 263, 174/266, 253; 156/250, 252; 428/131
See application file for complete search history.

(56) References Cited

U.S. PATENT DOCUMENTS

| | | | | |
|---|---|---|---|---|
| 5,117,069 A * | 5/1992 | Higgins, III | .............. | 174/261 |
| 5,153,987 A * | 10/1992 | Takahashi et al. | .............. | 29/852 |
| 5,167,997 A * | 12/1992 | Chamberlain et al. | .......... | 428/76 |
| 5,258,094 A * | 11/1993 | Furui et al. | ...................... | 216/20 |
| 5,347,712 A * | 9/1994 | Yasuda et al. | .................. | 29/852 |
| 5,374,469 A * | 12/1994 | Hino et al. | .................... | 428/209 |
| 5,374,788 A * | 12/1994 | Endoh et al. | .................. | 174/266 |
| 5,421,083 A * | 6/1995 | Suppelsa et al. | ................ | 29/852 |
| 5,451,721 A * | 9/1995 | Tsukada et al. | ................ | 174/261 |
| 5,502,893 A * | 4/1996 | Endoh et al. | .................. | 29/852 |
| 5,633,069 A * | 5/1997 | Shimizu et al. | .............. | 428/192 |
| 5,698,470 A * | 12/1997 | Yamaguchi | .................... | 216/20 |
| 5,826,330 A * | 10/1998 | Isoda et al. | ...................... | 29/852 |
| 6,201,194 B1 * | 3/2001 | Lauffer et al. | ................ | 174/264 |
| 6,374,788 B1 * | 4/2002 | Fukuhara et al. | .......... | 123/90.17 |
| 6,388,202 B1 * | 5/2002 | Swirbel et al. | ................ | 174/261 |
| 6,713,682 B1 * | 3/2004 | Hirahara et al. | .............. | 174/254 |

FOREIGN PATENT DOCUMENTS

CN 1798484 A 7/2006

* cited by examiner

*Primary Examiner* — Derris H Banks
*Assistant Examiner* — Tai Nguyen
(74) *Attorney, Agent, or Firm* — Jeffrey T. Knapp

(57) ABSTRACT

An exemplary method of making an FPC includes forming a substrate comprising metal foil layers interleaved with intervening layers by: (a) laminating intervening layers with metal foil layers; (b) adhering a covering film to outermost surfaces of the substrate; (c) defining a hole in one side of the substrate through the covering film and at least two metal foil layers and the intervening layer between the at least two metal foil layers by etching or laser technology; and (d) plating a portion of an inner wall of the hole with conductive material to form a via to electrically connect the at least two metal foil layers.

6 Claims, 2 Drawing Sheets

METHOD OF MAKING A FLEXIBLE PRINTED CIRCUIT BOARD

BACKGROUND

1. Technical Field

The present invention relates to printed circuit boards and, particularly, to a method of making a flexible printed circuit board.

2. Description of Related Art

Flexible printed circuit boards (FPCs) are in widespread use in electrical devices, such as cellular phones, digital still cameras, notebooks and so on, due to advantages of lightness, thinness, and flexibility. An FPC generally comprises at least one metal foil layer and at least one insulating layer with an optional adhesive layer between the metal foil layer and the insulating layer. Copper is the most popular material for use in the metal foil layer and is etched to form the circuit. Polyimide (PI) is widely used as the material of the insulating layer.

Nowadays, FPCs only having one metal foil layer are gradually being replaced by FPCs having more than one laminated metal foil layer in the course of pursuing greater miniaturization of electrical devices. To electrically connect the metal foil layers of an FPC, at least one through hole or via is defined through two metal foil layers of the FPC, and plated along an inner wall thereof with a conductive material. Commonly at least one of the outermost layers of an FPC is a metal foil layer, and the plating of the through holes results in that the outermost metal foil layer is also coated with an extra layer of plating thereon. The extra layer of plating makes the FPC less flexible.

What is needed, therefore, is a method of making an FPC which can avoid a formation of an extra layer of plating on the outermost metal foil layer.

SUMMARY

In accordance with a present embodiment, a method of making an FPC includes forming a substrate comprising metal foil layers interleaved with intervening layers by: (a) laminating intervening layers with metal foil layers; (b) adhering a covering film to outermost surfaces of the substrate; (c) defining a hole in one side of the substrate through the covering film and at least two metal foil layers and the intervening layer between the at least two metal foil layers by etching or laser technology; and (d) plating a portion of an inner wall of the hole with a conductive material to form a via to electrically connect the at least two metal foil layers.

Other advantages and novel features will be drawn from the following detailed description of at least one preferred embodiment, when considered in conjunction with the attached drawings.

BRIEF DESCRIPTION OF THE DRAWINGS

Many aspects of the present method of making the flexible printed circuit board can be better understood with reference to the following drawings. The components in the drawings are not necessarily drawn to scale, the emphasis instead being placed upon clearly illustrating the principles of the present camera module. Moreover, in the drawings, like reference numerals designate corresponding parts throughout the several views.

DETAILED DESCRIPTION OF THE PREFERRED EMBODIMENTS

Embodiments of the present flexible printed circuit board and method of making the flexible printed circuit board will now be described in detail below and with reference to the drawings.

Figure 1:
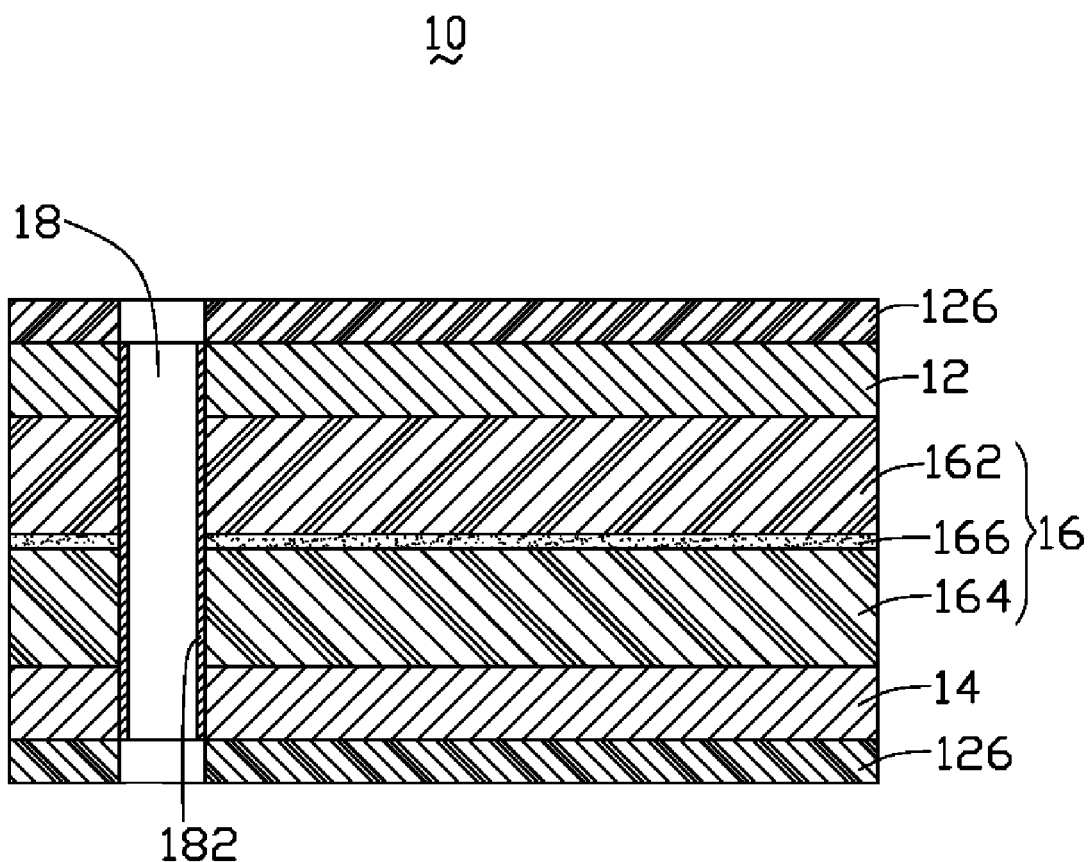
FIG. 1 is a cross-sectional view of a flexible printed circuit board, according to a first present embodiment.

Referring to FIG. 1, a flexible printed circuit board (FPC) 10 of a first present embodiment comprises a substrate having two metal foil layers 12, 14, an intervening layer 16 between the two metal foil layers 12, 14. Optionally, a covering film 126 is adhered to outermost surfaces of the substrate. The metal foil layers 12, 14 are subjected to etching to form circuits thereon. A hole 18 is defined in the substrate through opposite sides of the substrate by etching or laser technology. A portion of an inner wall of the hole 18 is plated with a conductive material 182 to form a via to electrically connect the metal foil layers 12, 14.

In the embodiment, the intervening layer 16 comprises two insulating layers 162, 164 and an adhesive layer 166 adhering the insulating layers 162, 164 together. The insulating layers 162, 164 respectively engage with inner sides of the metal foil layers 12, 14 to reinforce the metal foil layers 12, 14. Any other conventional patterns of the intervening layer 16 are feasible. Copper is a preferred material for use in the metal foil layers and is etched to form the circuit. Polyimide (PI) is a preferred material of the insulating layers. The covering film 126 is preferably made of insulative plastic.

A method of making the FPC 10 comprises forming a substrate comprising metal foil layers 12, 14 and an intervening layer 16 by: (a) laminating the intervening layer 16 with the metal foil layers 12, 14; (b) adhering a covering film 126 to outermost surfaces of the substrate; (c) defining a hole in the substrate through opposite sides of the substrate t by etching or laser technology; (d) plating a portion of an inner wall of the hole with a conductive material 182 to form a via to electrically connect the metal foil layers 12, 14. The method optionally comprises (e) removing the covering film 126 from the substrate.

Figure 2:
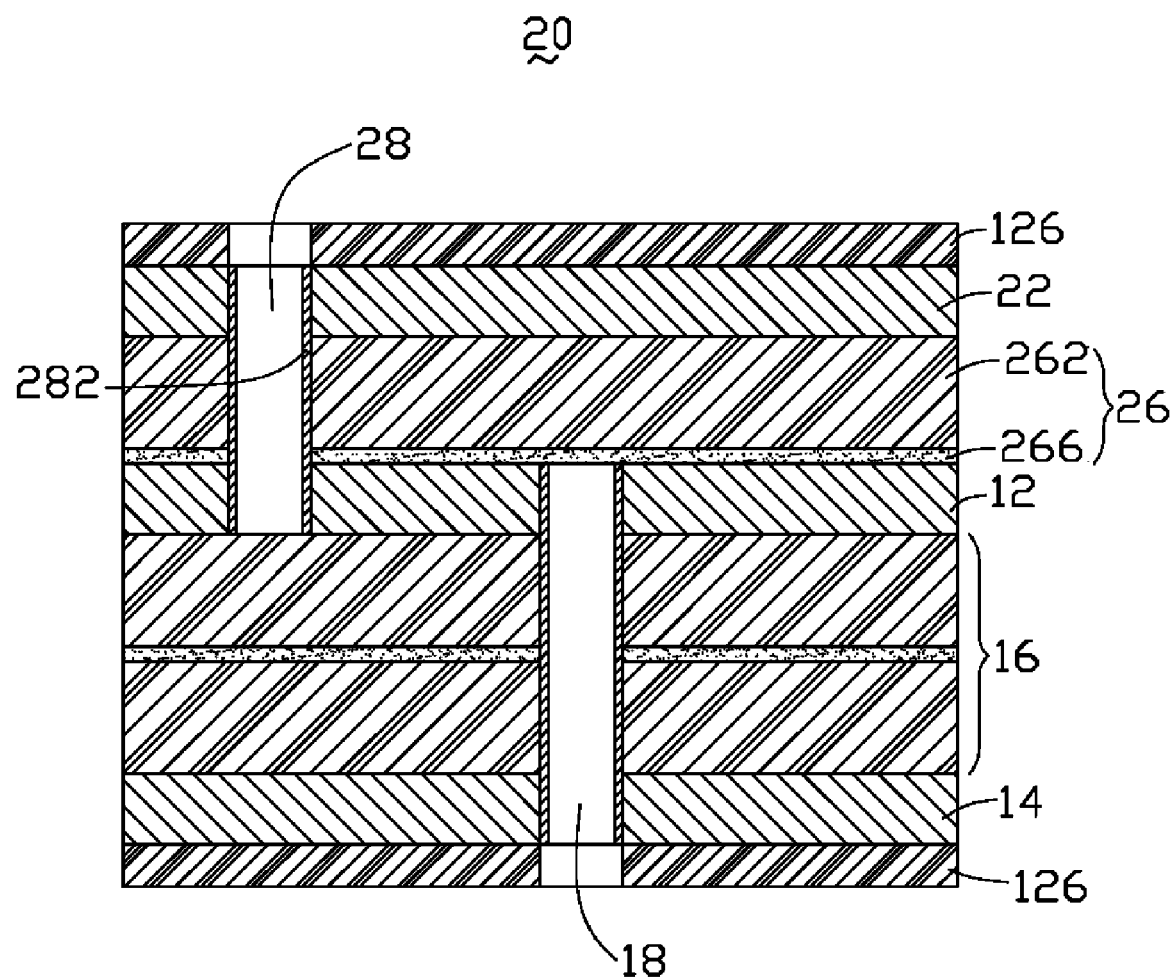
FIG. 2 is a cross-sectional view of a flexible printed circuit board, according to a second present embodiment.

A flexible printed circuit board (FPC) 20 of a second embodiment is illustrated in FIG. 2. The FPC 20 comprises a substrate with an optional covering film adhered to opposite surfaces of the substrate. The substrate comprises metal foil layers 12, 14 and the intervening layer 16 as the FPC 10, and further comprises a metal foil layer 22 and an intervening layer 26. As the FPC 10, a hole 18 is defined through the metal foil layers 12, 14 and the intervening layer 16 of FPC 20 to form a via to electrically connect the metal foil layers 12, 14. The intervening layer 26 of the FPC 20 in the embodiment comprises an insulating layer 262 for reinforcing the metal foil layer 22 and an adhesive layer 266 to adhere the insulating layer 262 to the metal foil layer 12. A hole 28 is defined in a side of the substrate through the covering film 126, the metal foil layers 22, 12 and the intervening layer 26 between the metal foil layers 22, 12. A portion of an inner wall of the hole 28 is plated with a conductive material 282 to form a via to electrically connect the metal foil layers 22, 12.

A method of making the FPC 20 comprises forming a substrate comprising metal foil layers 12, 14, 22 interleaved with intervening layers 16, 26 by: (a) laminating the intervening layers 16, 26 with the metal foil layers 12, 14, 22; (b) adhering a covering film 126 to outermost surfaces of the substrate; (c) defining a hole 18 in a side of the substrate through the covering film 126, the metal foil layers 12, 14 and the intervening layer 16 between the metal foil layers 12, 14, and defining a hole 28 in an opposite side of the substrate through the covering film 126, the metal foil layers 22, 12 and the intervening layer 26 between the metal foil layers 22, 12;

(d) plating a portion of an inner wall of the hole 18 with a conductive material to form a via to electrically connect the metal foil layers 12, 14, and plating a portion of an inner wall of the hole 28 with a conductive material 282 to form a via to electrically connect the metal foil layers 12, 22. The method optionally comprises (e) removing the covering film 126 from the substrate.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. A method of making a flexible printed circuit board (FPC) which comprises a substrate comprising a first metal foil layer, a second metal foil layer, a first intervening layer interleaved the first and second metal foil layers, a second intervening layer covered on the second metal foil layer, and a third metal foil layer covered on other side of the second intervening layer, the method comprising:

(a) laminating the substrate;
(b) adhering a covering film to outermost surfaces of the substrate;
(c) defining a hole in one side of the substrate through the covering film and the first and second metal foil layers and the first intervening layer and an additional hole in an opposite side of the substrate through the second and third metal foil layer and the second intervening layer; and
(d) plating a portion of an inner wall of the hole and the additional hole with a conductive material to form a via to electrically connect the at least two metal foil layers.

2. The method as claimed in claim 1, further comprising removing the covering film from the substrate.

3. The method as claimed in claim 1, wherein the hole is defined by etching or laser technology.

4. The method as claimed in claim 1, wherein the covering film is made of insulative plastic.

5. The method as claimed in claim 1, wherein the first intervening layer comprises two insulating layers and an adhesive layer adhering the insulating layers together.

6. The method as claimed in claim 1, wherein the second intervening layer comprises an insulating layer and an adhesive layer to adhere the insulating layer to the second metal foil layer.

* * * * *